US006765843B2

(12) United States Patent
Mori et al.

(10) Patent No.: US 6,765,843 B2
(45) Date of Patent: Jul. 20, 2004

(54) SEMICONDUCTOR MEMORY DEVICE WITH EFFICIENT BUFFER CONTROL FOR DATA BUSES

(75) Inventors: Kaoru Mori, Kawasaki (JP); Shuji Mabuchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/369,562

(22) Filed: Feb. 21, 2003

(65) Prior Publication Data

US 2004/0032790 A1 Feb. 19, 2004

(30) Foreign Application Priority Data

Aug. 19, 2002 (JP) ........................................ 2002-237926

(51) Int. Cl.[7] ............................................... G11C 8/00
(52) U.S. Cl. .............................. 365/230.03; 365/189.05
(58) Field of Search ...................... 365/230.03, 189.05, 365/63

(56) References Cited

U.S. PATENT DOCUMENTS 5,844,845 A * 12/1998 Tahara ................... 365/189.05
6,166,989 A * 12/2000 Hamamoto et al. ..... 365/230.03
6,381,191 B2 * 4/2002 Ooishi .................... 365/230.03

FOREIGN PATENT DOCUMENTS

JP        58-199490        11/1983

* cited by examiner

*Primary Examiner*—Huan Hoang
(74) *Attorney, Agent, or Firm*—Arent Fox PLLC

(57) ABSTRACT

A semiconductor memory device includes a plurality of memory blocks, a plurality of data buses provided for the respective memory blocks, a plurality of buffer circuits which are provided for the respective memory blocks, and relay data of the data buses to connect the data buses in series, a block activation circuit which generates block selection signals corresponding to the respective memory blocks, and asserts one of the block selection signals to selectively activate one of the memory blocks, and a plurality of buffer control circuits which are provided for the respective memory blocks, one of the buffer control circuits activating a corresponding one of the buffer circuits in response to assertion of a corresponding one of the block selection signals or in response to activation of one of the buffer circuits at an adjacent one of the memory blocks that is located upstream along the data buses.

10 Claims, 8 Drawing Sheets

SEMICONDUCTOR MEMORY DEVICE WITH EFFICIENT BUFFER CONTROL FOR DATA BUSES

BACKGROUND OF THE INVENTION

1. Field of the Invention

The present invention generally relates to semiconductor memory devices, and particularly relates to a semiconductor memory device having a plurality of memory blocks.

2. Description of the Related Art

In semiconductor memory devices, data read from a memory cell array are supplied to an output circuit through a data bus, and are then output to the exterior of the device from the output circuit through output terminals. The data bus generally tends to extend a long distance. When the memory cell array is comprised of a plurality of blocks, and outputs of the blocks are connected in series by the data bus, the length of the data bus becomes extremely lengthy. This results in a delay in signal transmission.

The time delay of data-bus signals is controlled by the capability of the driver that drives the data bus and by a CR time constant of the data bus lines. In order to shorten the time delay of signals, the diver capability may be boosted, or the signal lines may be widened to reduce R (resistance). Further, the intervals between adjacent signal lines may be extended to reduce C (capacitance). There is a limit to a reduction in signal transmission time that is achieved by boosting the driver capability, so that the enlargement of line widths and line intervals may always be necessary. In this case, however, the size of areas used for signal-line layout increases, resulting in an undesirable increase in the chip size.

In order to obviate these problems, Japanese Patent Laid-open No. 58-199490 teaches reducing transmission delays by dividing the data bus by use of relay buffers.

In the Japanese Patent Laid-open No. 58-199490, a plurality of divided data buses corresponding to a plurality of memory blocks are connected one after another by relay buffers. Since the divided data buses corresponding to the memory blocks are connected in series, relay buffers are driven at the position corresponding to the memory block that outputs data, and are also driven at positions located downstream relative to this position. Relay buffers are not driven at positions located upstream relative to this position. In order to achieve this, circuitry for obtaining an OR logic of block address signals is provided, and enables the relay buffers located downstream (i.e., located closer to the output terminals) relative to the stage where data is output.

For such a construction, the circuitry for obtaining an OR logic of address signals and additional address signal lines become necessary, resulting in increases in chip size and current consumption. In memory macros where the array configuration is modified according to specifications, further, the buffer selecting circuit and signal lines need to be modified depending on how many blocks are connected. A single circuit design cannot thus be used for all the different specifications.

Accordingly, there is a need for a semiconductor memory device that can achieve efficient buffer control in terms of chip size and current consumption in a construction where a plurality of data-bus stages are connected in series.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

In order to achieve these and other advantages in accordance with the purpose of the invention, a semiconductor memory device includes a plurality of memory blocks, a plurality of data buses provided for the respective memory blocks, a plurality of buffer circuits which are provided for the respective memory blocks, and relay data of the data buses to connect the data buses in series, a block activation circuit which generates block selection signals corresponding to the respective memory blocks, and asserts one of the block selection signals to selectively activate one of the memory blocks, and a plurality of buffer control circuits which are provided for the respective memory blocks, one of the buffer control circuits activating a corresponding one of the buffer circuits in response to assertion of a corresponding one of the block selection signals or in response to activation of one of the buffer circuits at an adjacent one of the memory blocks that is located upstream along the data buses.

In the semiconductor memory device as described above, the relay buffers are provided for the data buses, thereby enhancing data transfer speed without enlarging the line widths and line intervals of the data buses. The semiconductor memory device also utilizes the signals for block activation in order to properly control the activation/deactivation of the relay buffer circuits. This achieves efficient buffer control in terms of chip size and current consumption.

According to another aspect of the present invention, a semiconductor memory device includes a plurality of memory blocks, a plurality of data buses provided for the respective memory blocks, a plurality of buffer circuits which are provided for the respective memory blocks, and relay data of the data buses to connect the data buses in series, a block activation circuit which generates block selection signals corresponding to the respective memory blocks, and asserts one of the block selection signals to selectively activate one of the memory blocks, and a plurality of buffer control circuits which are provided for the respective memory blocks, one of the buffer control circuits deactivating a corresponding one of the buffer circuits in response to assertion of a corresponding one of the block selection signals and otherwise activating the corresponding one of the buffer circuits.

In the semiconductor memory device described above, only the buffer circuit that is situated upstream next to the data outputting memory block is deactivated at the time of data output from the memory block, and the remaining buffer circuits are activated. At times other than the time of data output, all the buffer circuits are kept active. This insures that the data buses do not float even at times other than the time of data output, which prevents through currents from running in the buffer circuits and the like. There is thus no need for information hold circuits or the like for holding the data of the data buses to either HIGH or LOW, thereby making it possible to achieve efficient buffer control in terms of chip size and current consumption.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
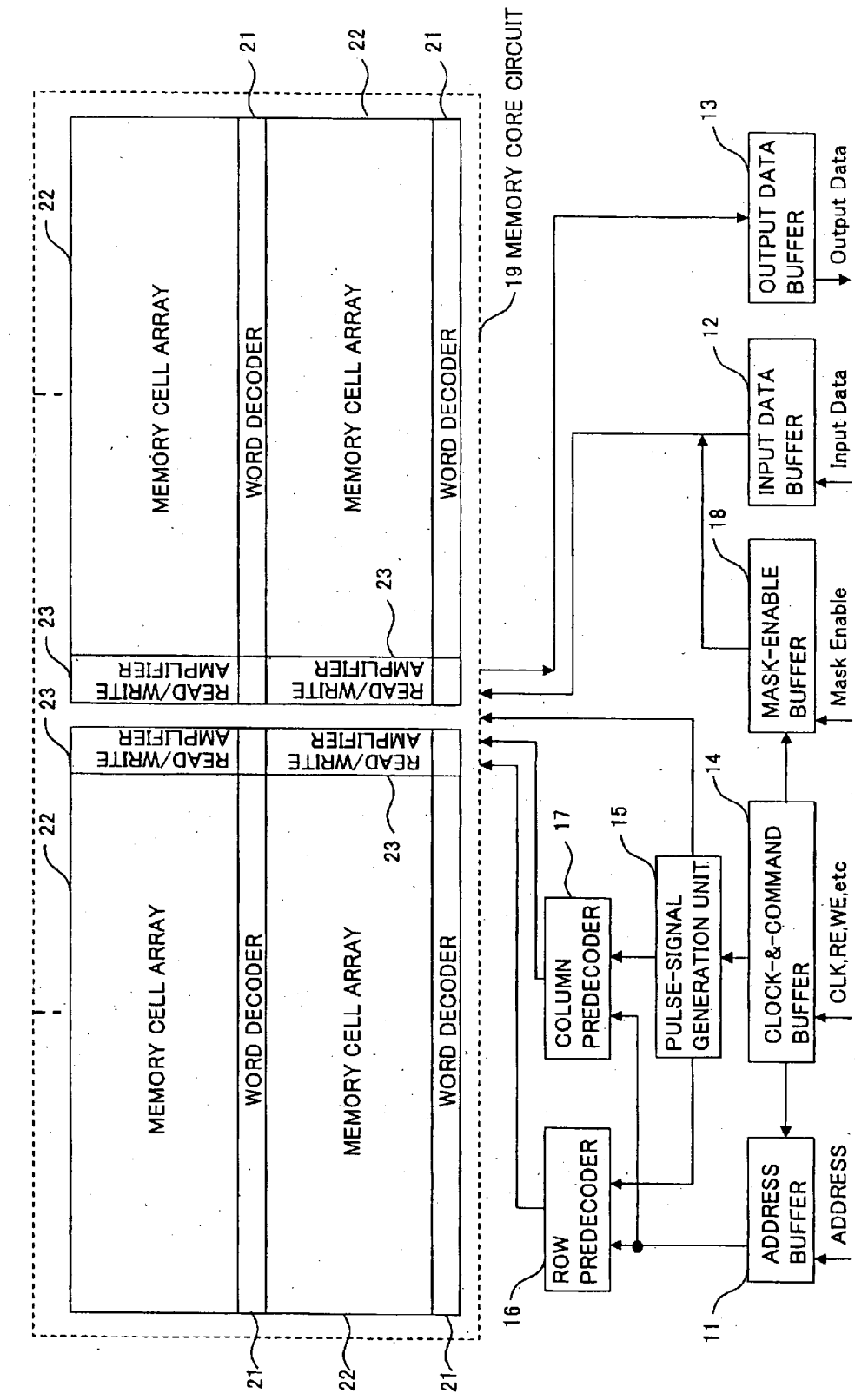
FIG. 1 is a block diagram showing a construction of a semiconductor memory device to which the present invention is applied.

FIG. 1 is a block diagram showing a construction of a semiconductor memory device to which the present invention is applied.

A semiconductor memory device 10 of FIG. 1 includes an address buffer 11, an input data buffer 12, an output data buffer 13, a clock-&-command buffer 14, a pulse-signal generation unit 15, a row predecoder 16, a column predecoder 17, a mask-enable buffer 18, and a memory core circuit 19. The memory core circuit 19 includes a plurality of column decoders (not shown), a plurality of word decoders 21, a plurality of memory cell arrays 22, and a plurality of read/write amplifiers 23.

In each of the memory cell arrays 22, a plurality of memory cells are arranged in matrix form, and each of the memory cells stores data therein. Further, word lines, bit lines, column lines, etc., are provided, surrounded by circuitries and cross-connect lines for address selection and data amplification that are carried out at the time of data read/write operations with respect to memory cells. Each of the memory cell arrays 22 is provided as a single block. The word decoders 21 selectively activate word lines in the memory cell arrays 22 according to address selection. The read/write amplifiers 23 amplify data read from or written to the memory cells corresponding to the selected word.

The address buffer 11 receives address signals from the exterior of the device, and supplies the address signals to the row predecoder 16 and the column predecoder 17 at proper timing.

The input data buffer 12 receives data from the exterior of the device, and supplies the data to the memory core circuit 19 at proper timing. The output data buffer 13 receives data retrieved from the memory core circuit 19, and outputs the data to the exterior at appropriate timing.

The clock-&-command buffer 14 receives a clock signal CLK from the exterior, and further receives control signals RE, WE, etc., followed by decoding commands represented by the control signals. The clock-&-command buffer 14 supplies the decoded results and the clock signal to the pulse-signal generation unit 15, and further supplies the clock signal to the address buffer 11, the mask-enable buffer 18, and so on.

Based on the decoded results and the clock signal, the pulse-signal generation unit 15 generates and supplies pulse signals for controlling the operation and timing of various units such as the row predecoder 16, the column predecoder 17, the memory core circuit 19, etc. Namely, the pulse-signal generation unit 15 supplies control timing signals to each relevant unit in the semiconductor memory device, and each unit operates at proper timing, thereby achieving data write/read operations of the semiconductor memory device.

The row predecoder 16 and the column predecoder 17 pre-decode the row address and the column address, respectively, supplied from the address buffer 11. The pre-decoded addresses are supplied to the memory core circuit 19.

A word decoder 21 of the memory core circuit 19 decodes the pre-decoded address supplied from the row predecoder 16, and activates a word line corresponding to the selected row address. The column decoder decodes the pre decoded address supplied from the column predecoder 17, and activates a column line corresponding to the selected column address.

In the case of a read operation, data are supplied to the bit lines from the memory cells corresponding to the activated word line, and, then, the data corresponding to the activated column line is supplied from the bit lines to the data bus through the read/write amplifier 23. The data on the data bus is supplied to the output data buffer 13, followed by being output to the exterior of the device. In the case of a write operation, data is written to memory cells corresponding to the activated column line and the activated word line after traveling through data paths in a reverse direction to the case of the read operation.

Figure 2:
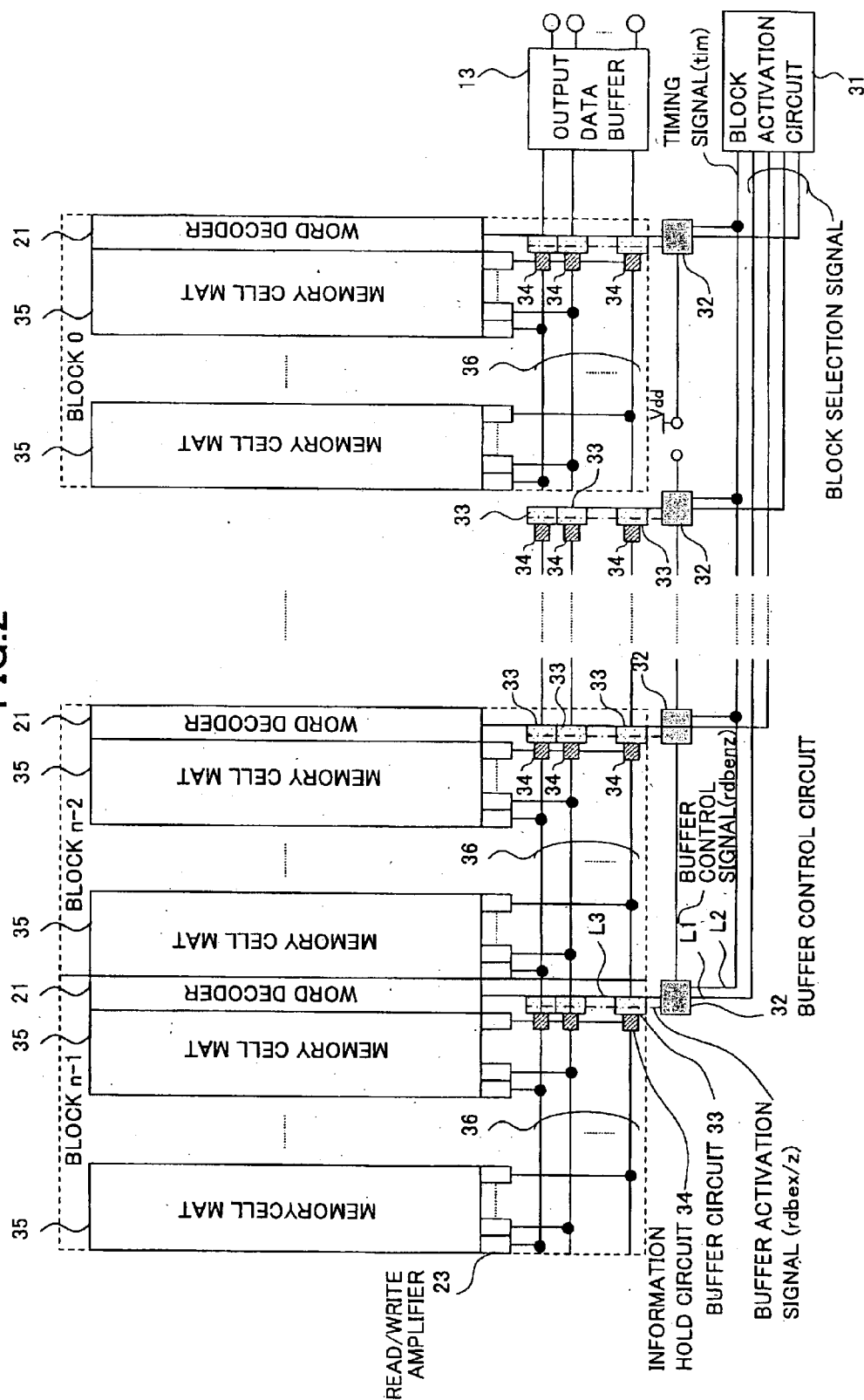
FIG. 2 is a block diagram showing a first embodiment of a buffer control circuit for controlling buffers for data buses according to the present invention.

FIG. 2 is a block diagram showing a first embodiment of a buffer control circuit for controlling buffers for the data bus according to the present invention.

In FIG. 2, a single block includes a single set of a word decoder 21, a memory cell array 22, and a read/write amplifier 23. Each memory cell array 22 includes a plurality of memory mats 35.

In FIG. 2, the plurality of blocks are arranged in a direction in which data buses 36 extends, thereby constituting the memory core circuit 19 shown in FIG. 1. The data buses 36 that transfer an output supplied from a block are connected in series via buffer circuits 33. Buffer control circuits 32 are provided for the respective blocks, and control the activation/deactivation of the respective buffer circuits 33. The buffer circuits 33 are situated at a cross section where the word decoder area and the data bus area intersect each other.

A block activation circuit 31 supplies a corresponding block selection signal and a timing signal to each block based on the pre-decoded address. When a block is selected by an address provided from the exterior, a block selection signal corresponding to the selected block is asserted. In the example of FIG. 2, a construction is such that a block selection signal and the timing signal are supplied separately. These two signals, however, may be combined together such that the block selection signal also indicates timing. The buffer control circuits 32 provided for the respective blocks receive the timing signal and the respective block selection signals.

Taking a block n−1 as a block of interest, a block activation signal corresponding to this block is supplied to a corresponding buffer control circuit 32 through a signal line L1 shown in FIG. 2. Further, the timing signal is supplied to this buffer control circuit 32 through a signal line L2 shown in FIG. 2. The block activation signal transferred through the signal line L1 does not stop at the buffer control circuit 32, but further travels through a signal line L3 to the word decoder 21. The signal line L3 is situated in a layer above or below the buffer control circuit 32. In this manner, the block selection signal is supplied to both the corresponding buffer control circuit 32 and the corresponding word decoder 21.

A buffer control circuit 32 controls the activation/deactivation of corresponding buffer circuits 33 based on the corresponding block selection signal and a buffer control signal rdbenz, which is supplied form the adjacent buffer control circuit 32 located upstream. In detail, the buffer control circuit 32 activates the corresponding buffer circuits 33 if the corresponding block selection signal is asserted to indicate the outputting of data from the corresponding block. In this case, further, the buffer control circuit 32 asserts the buffer control signal rdbenz to the adjacent buffer control circuit 32 located downstream. Even if the corresponding block selection signal is not asserted, and, thus, no data is output from the corresponding block, the buffer control circuit 32 activates the corresponding buffer circuits 33 if the buffer control signal rdbenz from the upstream buffer control circuit 32 is asserted. In this manner, provision is made to activate the buffer circuits 33 at the position corresponding to the data outputting block and also at other positions situated further downstream.

In the present invention, the relay buffers 33 are provided for the data buses 36, thereby enhancing data transfer speed without enlarging the line widths and line intervals of the data buses 36. The present invention also utilizes the signals for block activation, thereby properly controlling the activation/deactivation of the relay buffer circuits 33.

Figure 3:
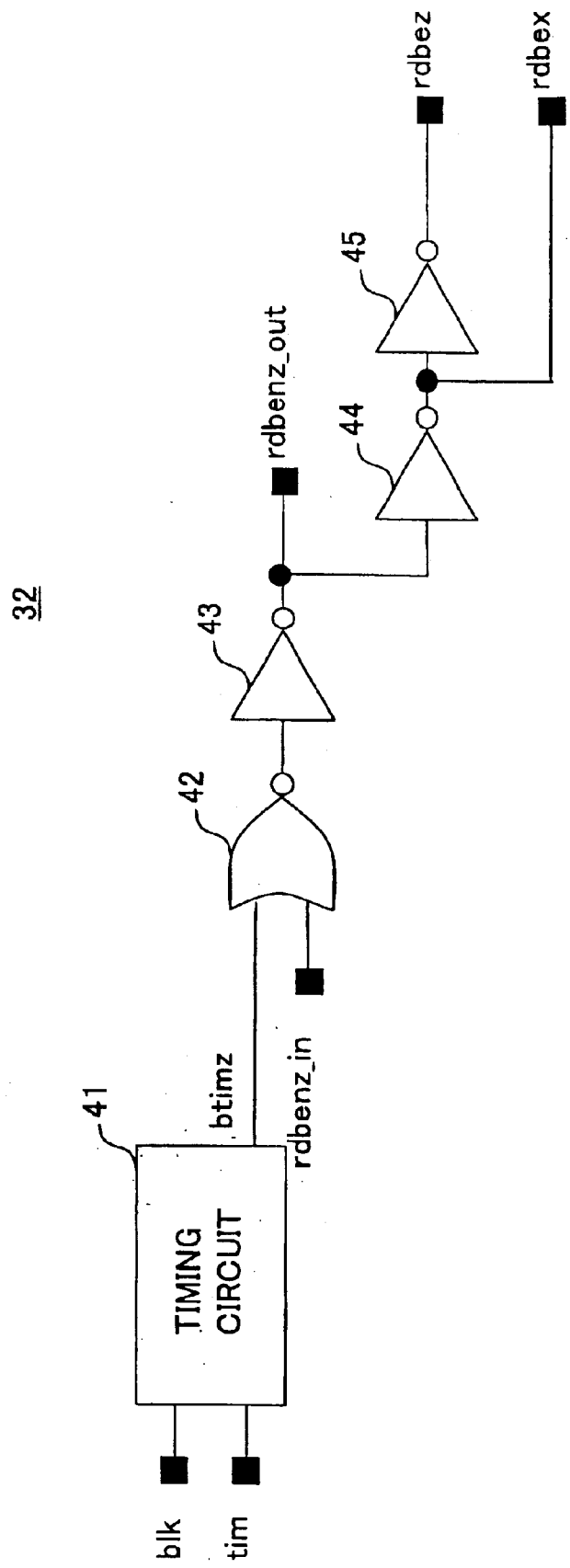
FIG. 3 is a circuit diagram showing an example of a buffer control circuit.

FIG. 3 is a circuit diagram showing an example of the buffer control circuit 32.

The buffer control circuit 32 of FIG. 3 includes a timing circuit 41, a NOR gate 42, and inverters 43 through 45. The timing circuit 41 receives a block selection signal blk corresponding to its own block and a timing signal tim from the block activation circuit 31, and asserts an output signal btimz if both the received signals are asserted. The basic construction of the timing circuit 41 includes an AND gate, and may include other circuitry for timing adjustment. The NOR gate 42 receives the signal btimz from the timing circuit 41, and further receives a buffer control signal rdbenz_in supplied from the adjacent buffer control circuit 32 situated upstream. The NOR gate 42 and the inverter 43 obtain an OR operation between the signal btimz and the buffer control signal rdbenz_in, and the obtained OR logic is thus output as a buffer control signal rdbenz_out to the next stage situated downstream. Further, the OR operation between the signal btimz and the buffer control signal rdbenz_in travels through one or two of the inverters 44 and 45, thereby producing complementary buffer activation signals rdbez and rdbex, which are supplied to the buffer circuits 33.

Through proper timing control of the signal btimz by the timing circuit 41, the timing at which the buffer circuits 33 are activated is set to desired timing. The buffer activation timing may be set such as to activate the buffer circuits 33 simultaneously with or immediately after data inputs from the data buses 36 are settled. This makes it possible to reduce current consumption for driving the data buses.

Figure 4:
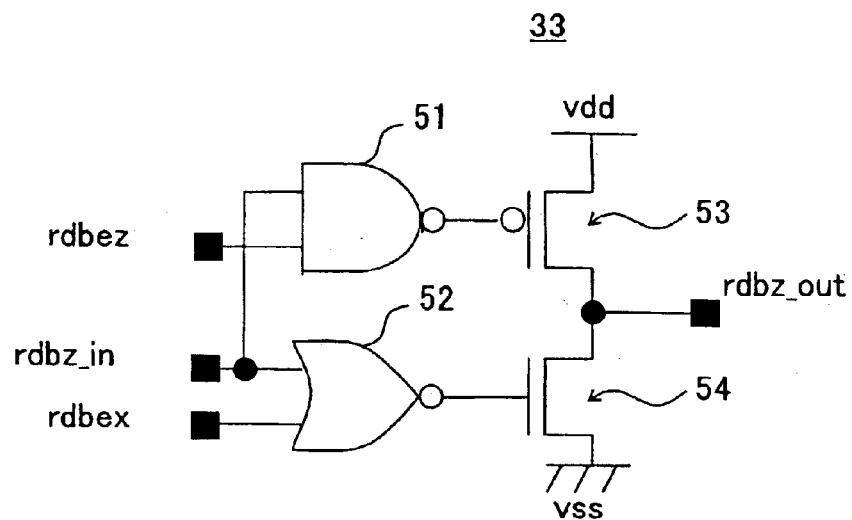
FIG. 4 is a circuit diagram showing an example of a buffer circuit.

FIG. 4 is a circuit diagram showing an example of the buffer circuit 33.

The buffer circuit 33 of FIG. 4 includes a NAND gate 51, a NOR gate 52, a PMOS transistor 53, and an NMOS transistor 54. The NAND gate 51 receives an input data signal rdbz_in from the data buses 36, and further receives the buffer activation signal rdbez from the corresponding buffer control circuit 32. The NOR gate 52 receives the input data signal rdbz_in from the data buses 36, and further receives the buffer activation signal rdbex from the corresponding buffer control circuit 32. The output of the NAND gate 51 drives the PMOS transistor 53, and the output of the NOR gate 52 drives the NMOS transistor 54. In this manner, the buffer circuit 33 is activated when the buffer activation signals rdbez and rdbex are HIGH and LOW, respectively.

Figure 5:
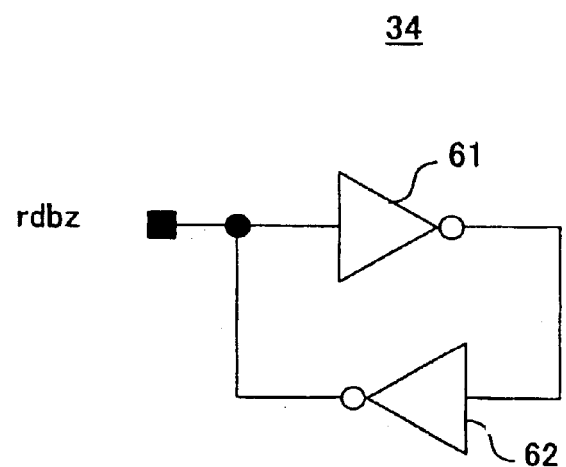
FIG. 5 is a circuit diagram showing an example of an information hold circuit.

FIG. 5 is a circuit diagram showing an example of an information hold circuit 34.

Information hold circuits 34 are provided in front of the buffer circuits 33 at each stage of the data buses 36 as shown in FIG. 2, and serve to fix the signal levels of the data buses 36 to either HIGH or LOW so as to prevent them from floating. When no data is output from memory blocks as in a standby mode, all the buffer circuits 33 are placed in an inactivated state. Without the information hold circuits 34, therefore, the data buses 36 would be afloat. If the data buses 36 are afloat, a through current runs through devices that receive data from the data buses (i.e., the NAND gate 51, the NOR gate 52, the PMOS transistor 53, and the NMOS transistor 54 of the buffer circuits 33 situated at the downstream end in FIG. 2), resulting in excess power consumption. In order to avoid this, the information hold circuits 34 are provided.

As shown in FIG. 5, the information hold circuit 34 includes a latch comprised of inverters 61 and 62. This latch stores data at the time of data output, and holds the data thereafter to prevent the data buses 36 from slipping into an afloat state even at the time of standby mode.

Figure 6:
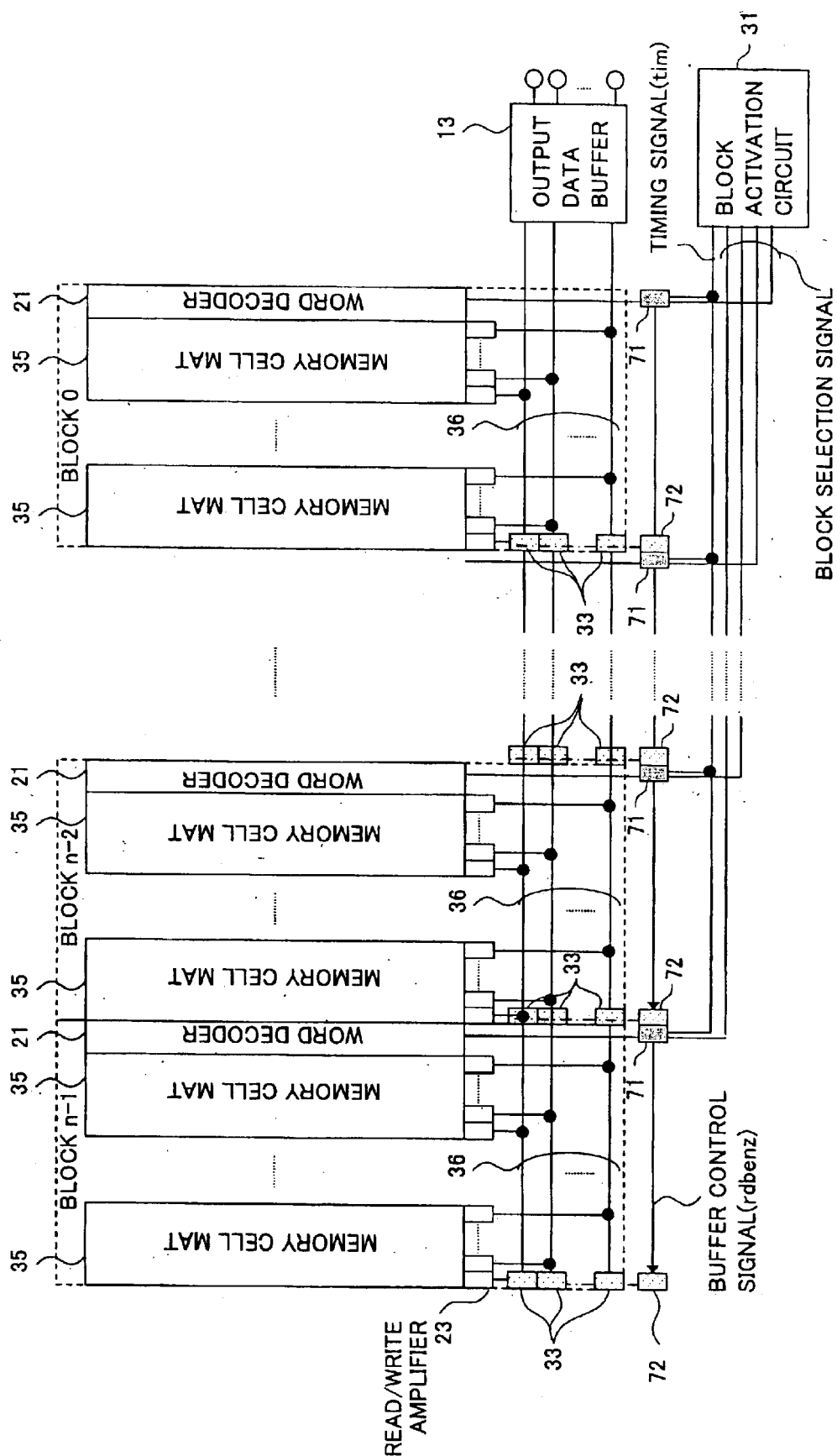
FIG. 6 is a block diagram showing a second embodiment of a buffer control circuit for controlling buffers for data buses according to the present invention.

FIG. 6 is a block diagram showing a second embodiment of a buffer control circuit for controlling buffers for the data bus according to the present invention. In FIG. 6, the same elements as those of FIG. 2 are referred to by the same numerals, and a description thereof will be omitted.

The second embodiment shown in FIG. 6 includes buffer control circuits 71 and 72 in place of the buffer control circuits 32 of the first embodiment shown in FIG. 2, and has no information hold circuit 34 in contrast with the first embodiment. In the second embodiment shown in FIG. 6, buffer circuits 33 situated upstream next to the data outputting block are deactivated at the time of data output from the memory core circuit, and the remaining buffer circuits 33 are activated. At times other than the time of data output, the buffer circuits 33 are kept active. This insures that the data buses 36 do not float even at times other than the time of data output, which prevents through currents.

The buffer control circuit 71 corresponding to a given memory block receives the timing signal and the corresponding block selection signal from the block activation circuit 31. When both of the received signals, the buffer control circuit 71 deactivates the buffer control signal rdbenz as its output signal, which is coupled to the buffer control circuit 72 provided upstream relative to the given block. In response to the deactivation of the buffer control signal rdbenz, the buffer control circuit 72 deactivates the corresponding buffer circuits 33, which are provided upstream relative to the data bus 36 corresponding to the given block. The remaining buffer circuits 33 are in an activated state at other blocks. Further, the inputs into the buffer circuits 33 provided furthest upstream may be fixed to HIGH or LOW.

Figure 7:
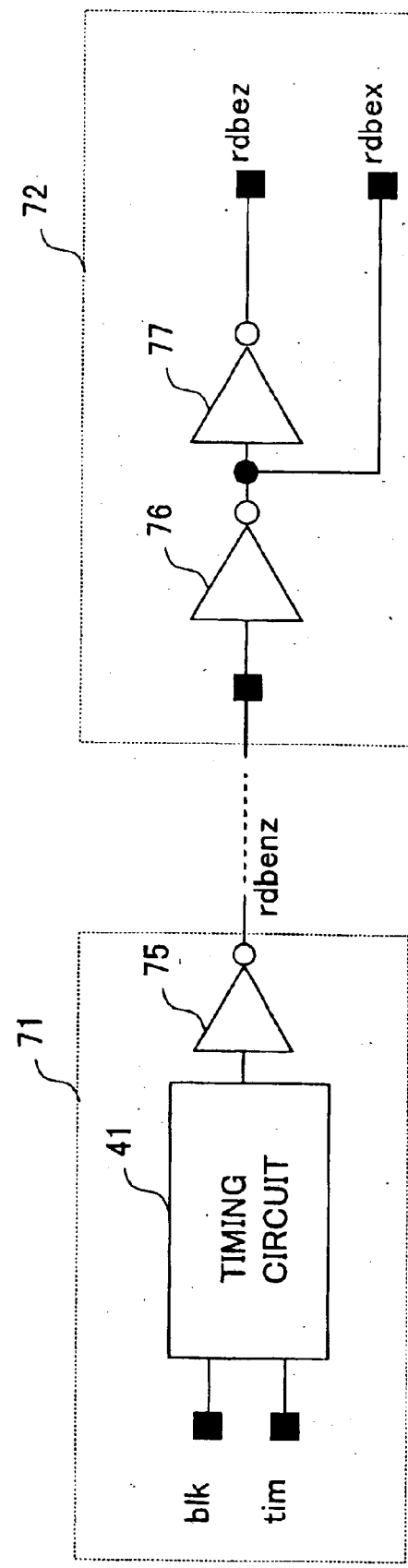
FIG. 7 is a circuit diagram showing an example of buffer control circuits shown in FIG. 6.

FIG. 7 is a circuit diagram showing an example of the buffer control circuit 71 and the buffer control circuit 72.

As shown in FIG. 7, the buffer control circuit 71 includes the timing circuit 41 and an inverter 75. The timing circuit 41 is the same as the timing circuit 41 used in the buffer control circuit 32 of FIG. 3. The output of the timing circuit 41 becomes HIGH when both the block selection signal blk and the timing signal tim are asserted. In this case, the buffer control signal rdbenz output from the inverter 75 becomes LOW.

The buffer control circuit 72 includes inverters 76 and 77. As the buffer control signal rdbenz changes to LOW, the buffer activation signals rdbez and rdbex become LOW and HIGH, respectively, thereby deactivating the corresponding buffer circuits 33.

In the second embodiment of the present invention, the relay buffers 33 are provided for the data buses 36, thereby enhancing data transfer speed without enlarging the line widths and line intervals of the data buses 36. The second embodiment of the present invention also utilizes the signals for block activation, thereby properly controlling the activation/deactivation of the relay buffer circuits 33. In so doing, control is made to deactivate only the buffer circuits 33 situated upstream next to the data outputting block. If the period of deactivation is set equal to the activation period of the read/write amplifiers 23, the information hold circuits as in the first embodiment are not necessary. When a large number of data bus signal lines prevent sufficient space from being set aside for the information hold circuits 34, the second embodiment is particularly advantageous since it can make efficient use of chip area.

Figure 8:
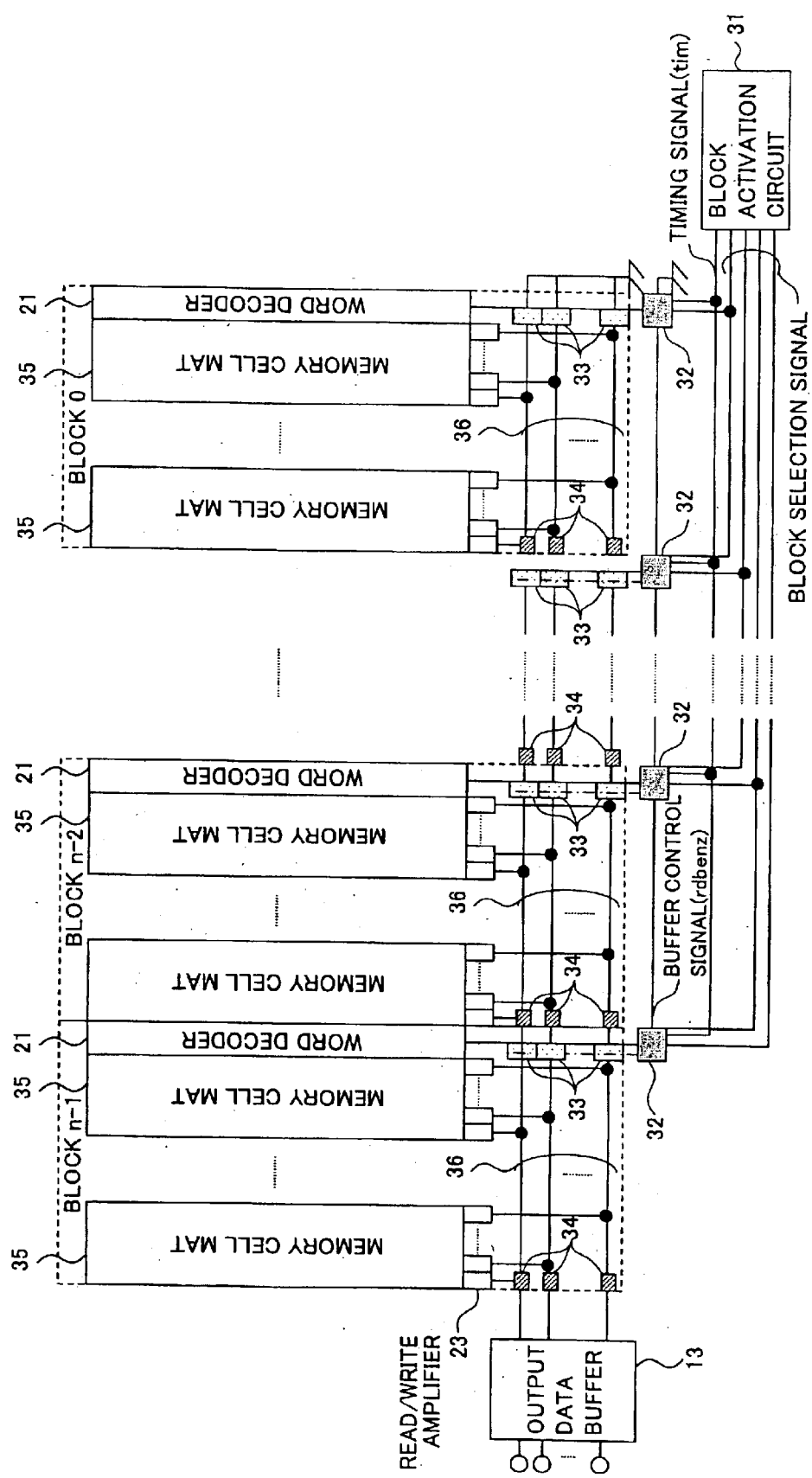
FIG. 8 is a block diagram showing a third embodiment of a buffer control circuit for controlling buffers for data buses according to the present invention.

FIG. 8 is a block diagram showing a third embodiment of a buffer control circuit for controlling buffers for the data bus according to the present invention. In FIG. 8, the same elements as those of FIG. 2 are referred to by the same numerals, and a description thereof will be omitted.

The third embodiment shown in FIG. 8 differs from the first embodiment shown in FIG. 2 in that the direction of data propagation through the data buses 36 is opposite. In the first embodiment shown in FIG. 2, the block activation circuit 31 provided on the right-hand side in the drawing supplies the block selection signals and the timing signal, and data of the data buses 36 propagate to the output data buffer 13 situated on the right-hand side in the drawing. In the third embodiment shown in FIG. 8, on the other hand, the block activation circuit 31 provided on the right-hand side in the drawing supplies the block selection signals and the timing signal, and data of the data buses 36 propagate to the output data buffer 13 situated on the left-hand side in the drawing. In the construction shown in FIG. 2, a total length of signal transmission paths from the block activation circuit 31 to the output data buffer 13 is the shortest with respect to the block 0 and the longest with respect to the block n-1. There is thus a large timing difference, depending on the block position where data is output. In the construction shown in FIG. 8, a total length of signal transmission paths from the block activation circuit 31 to the output data buffer 13 is substantially constant with respect to all the blocks. This reduces the timing difference that exist between the different positions of data outputting blocks.

In the construction illustrated in FIG. 8, the buffer control circuit 32 corresponding to a given block receives a block selection signal that belongs to the adjacent block situated upstream. Each buffer control circuit 32 is provided upstream relative to the data bus 36 of the corresponding memory block. If the buffer circuits 33 were activated based on the block selection signal belonging to the corresponding memory block, the data bus 36 of the data outputting block would be undesirably affected by data coming down from upstream.

If the block activation circuit 31 is moved to the left-hand side in the drawing in the construction shown in FIG. 2, for example, each buffer control circuit 32 is situated at the downstream end of the corresponding data bus 36. In such a case, the buffer circuits 33 should be activated based on the block selection signal that belongs to the corresponding memory block. Even in the construction illustrated in FIG. 8, the activation of the buffer circuits 33 can be regarded as being based on the block selection signal belonging to the corresponding memory block if the matching relation between the buffer control circuits 32 and the memory blocks are shifted properly.

Figure 9:
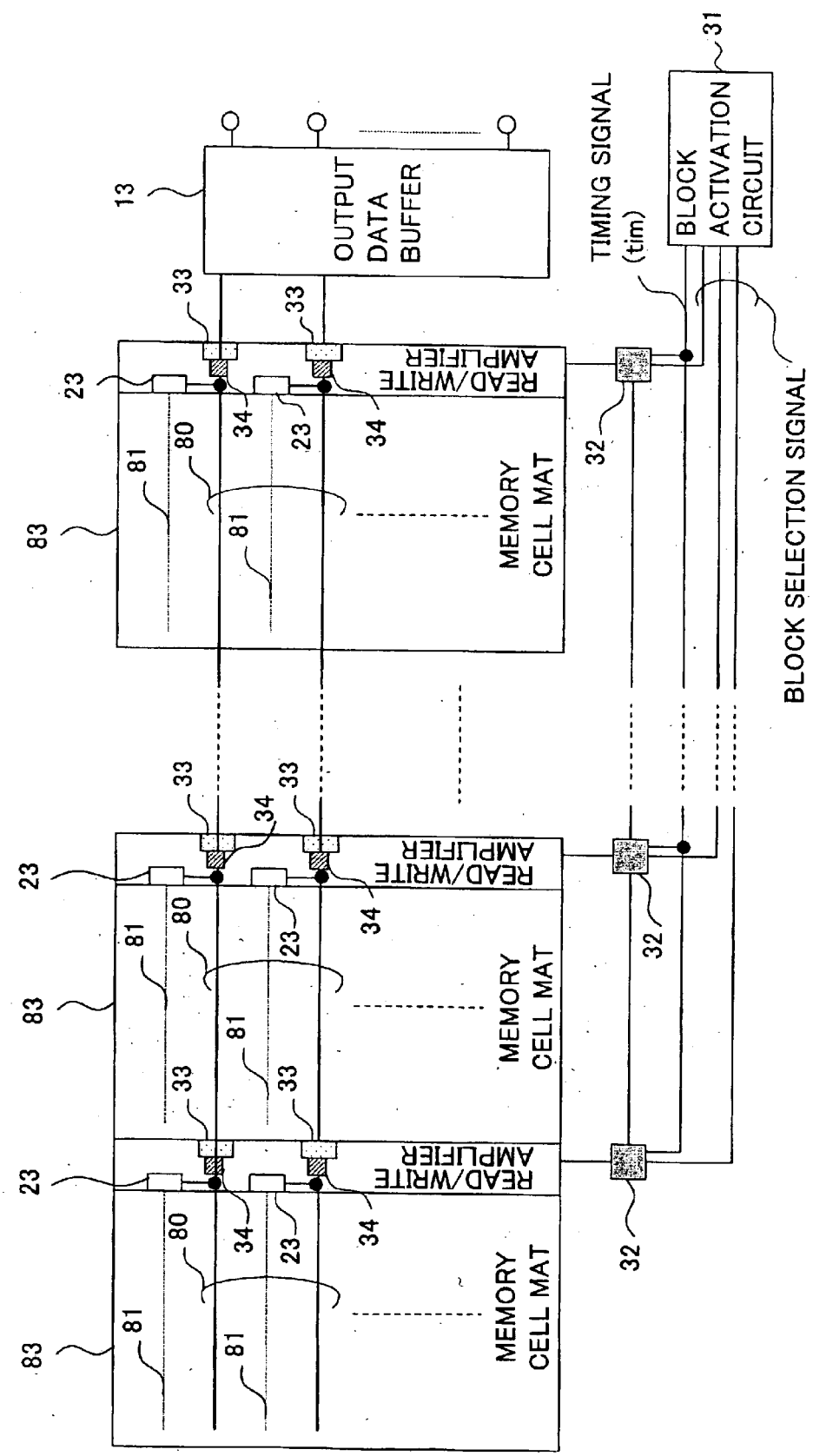
FIG. 9 is a block diagram showing a fourth embodiment of a buffer control circuit for controlling buffers for data buses according to the present invention.

FIG. 9 is a block diagram showing a fourth embodiment of a buffer control circuit for controlling buffers for the data bus according to the present invention. In FIG. 9, the same elements as those of FIG. 2 are referred to by the same numerals, and a description thereof will be omitted.

The first through third embodiments described above have layouts in which the buffer circuits 33 of the data buses 36 are situated at or around the cross sections between the word decoders 21 and the data bus areas. In the fourth embodiment shown in FIG. 9, the buffer circuits 33 are provided in the areas for the read/write amplifiers 23.

In FIG. 9, data buses 80 are superimposed on memory cell mats 83, each of which corresponds to a single memory block. The memory cell mats 83 are arranged such that the data buses 80 are connected in series, with the buffer circuits 33 relaying between the data buses 80. The data buses 80 receive read data from local data buses 81 via the read/write amplifiers 23. The logic construction of this circuitry is the same as that of the first embodiment shown in FIG. 2, despite apparent differences in the physical layout of the circuitry. The buffer circuits 33 are controlled by the buffer control circuits 32 corresponding to the respective memory blocks. Further, the information hold circuits 34 are provided for the data buses 80 for the purpose of preventing the signal levels of the data buses 80 from being afloat.

As illustrated in FIG. 9, the buffer circuits 33 are situated in the areas for the read/write amplifiers 23. Such circuit arrangement makes it possible to make efficient use of the chip area of the semiconductor memory device.

Further, the present invention is not limited to these embodiments, but various variations and modifications may be made without departing from the scope of the present invention.

The present application is based on Japanese priority application No. 2002-237926 filed on Aug. 19, 2002, with the Japanese Patent Office, the entire contents of which are hereby incorporated by reference.

What is claimed is:

1. A semiconductor memory device, comprising:
  a plurality of memory blocks;
  a plurality of data buses provided for the respective memory blocks;

a plurality of buffer circuits which are provided for the respective memory blocks, and relay data of said data buses to connect said data buses in series;

a block activation circuit which generates block selection signals corresponding to the respective memory blocks, and asserts one of the block selection signals to selectively activate one of said memory blocks; and a plurality of buffer control circuits which are provided for the respective memory blocks, one of said buffer control circuits activating a corresponding one of said buffer circuits in response to assertion of a corresponding one of the block selection signals or in response to activation of one of said buffer circuits at an adjacent one of said memory blocks that is located upstream along said data buses.

2. The semiconductor memory device as claimed in claim 1, wherein said one of said buffer control circuits receives a buffer control signal from an adjacent buffer control circuit that is situated upstream, said one of said buffer control circuits activating the corresponding one of said buffer circuits and asserting a buffer control signal supplied to an adjacent buffer control circuit situated downstream in response to the assertion of the corresponding one of the block selection signals or in response to assertion of the buffer control signal received from the adjacent buffer control circuit that is situated upstream.

3. The semiconductor memory device as claimed in claim 1, further comprising information hold circuits which are provided for the respective memory blocks, and hold data levels of said data buses when said buffer circuits are inactive.

4. The semiconductor memory device as claimed in claim 1, wherein said one of said buffer control circuits activates the corresponding one of said buffer circuits simultaneously with or after timing at which the corresponding one of said buffer circuits receives data from said data buses.

5. The semiconductor memory device as claimed in claim 1, wherein signal lines through which said block activation circuit supplies the block selection signals are laid substantially in parallel to said data buses, and wherein a direction in which the block selection signals propagate on the signal lines is same as a direction in which data signals propagate on said data buses.

6. The semiconductor memory device as claimed in claim 1, further comprising word decoders, each of which selects a word with respect to a corresponding one of said memory blocks, said buffer circuits provided at cross sections where an extension of said word decoders and said data buses intersect.

7. The semiconductor memory device as claimed in claim 1, further comprising amplifiers which amplify data supplied from said memory blocks to said data buses, wherein said data buses are superimposed on said memory blocks, and said buffer circuits are situated in areas where said amplifiers are generally situated.

8. A semiconductor memory device, comprising:

a plurality of memory blocks;

a plurality of data buses provided for the respective memory blocks;

a plurality of buffer circuits which are provided for the respective memory blocks, and relay data of said data buses to connect said data buses in series;

a block activation circuit which generates block selection signals corresponding to the respective memory blocks, and asserts one of the block selection signals to selectively activate one of said memory blocks; and a plurality of buffer control circuits which are provided for the respective memory blocks, one of said buffer control circuits deactivating a corresponding one of said buffer circuits in response to assertion of a corresponding one of the block selection signals and otherwise activating the corresponding one of said buffer circuits.

9. The semiconductor memory device as claimed in claim 8, wherein said buffer circuits are provided at an upstream end of the respective data buses in the respective memory blocks.

10. The semiconductor memory device as claimed in claim 8, wherein said buffer control circuits receive a timing signal indicative of a period during which one of said memory blocks is activated, said one of said buffer control circuits deactivating the corresponding one of said buffer circuits for the period indicated by the timing signal in response to the assertion of the corresponding one of the block selection signals.

\* \* \* \* \*